United States Patent
Holyoak et al.

(10) Patent No.: US 10,181,837 B2
(45) Date of Patent: Jan. 15, 2019

(54) WIDELY TUNABLE CAVITY FILTER USING LOW VOLTAGE, LARGE OUT-OF-PLANE ACTUATION MEMS

(71) Applicant: LGS INNOVATIONS LLC, Herndon, VA (US)

(72) Inventors: Michael Jarret Holyoak, Morristown, NJ (US); George Kenneth Kannell, Florham Park, NJ (US); Marc Jay Beacken, Randolph, NJ (US); David J. Bishop, Brookline, MA (US); Jackson Chang, Newtown, MA (US); Matthias Imboden, St. Blaise NE (CH)

(73) Assignee: LGS Innovations LLC, Herndon, VA (US)

( * ) Notice: Subject to any disclaimer, the term of this patent is extended or adjusted under 35 U.S.C. 154(b) by 126 days.

(21) Appl. No.: 15/274,414

(22) Filed: Sep. 23, 2016

(65) Prior Publication Data
US 2017/0141754 A1    May 18, 2017

Related U.S. Application Data

(60) Provisional application No. 62/254,387, filed on Nov. 12, 2015.

(51) Int. Cl.
| | |
|---|---|
| H01P 7/06 | (2006.01) |
| H03H 9/46 | (2006.01) |
| H01P 1/205 | (2006.01) |
| H01P 7/04 | (2006.01) |

(52) U.S. Cl.
CPC ............ H03H 9/462 (2013.01); H01P 1/205 (2013.01); H03H 9/465 (2013.01); *H01P 7/04* (2013.01); *H03J 2200/39* (2013.01)

(58) Field of Classification Search
CPC .................................. H03H 9/462; H01P 7/06
USPC ................................. 333/186, 227, 231, 232
See application file for complete search history.

(56) References Cited

U.S. PATENT DOCUMENTS

| | | | | |
|---|---|---|---|---|
| 4,692,727 | A * | 9/1987 | Wakino | H01P 7/10 333/202 |
| 7,586,393 | B2 * | 9/2009 | Tilmans | H01P 7/06 333/227 |
| 8,362,853 | B2 * | 1/2013 | Park | H01P 1/127 331/107 DP |
| 2017/0141755 | A1 * | 5/2017 | Holyoak | H03H 9/465 |

* cited by examiner

*Primary Examiner* — Dean Takaoka
(74) *Attorney, Agent, or Firm* — Baker & Hostetler LLP

(57) ABSTRACT

The present application is directed to a tunable filter system. The system includes a resonator having an inner wall surrounding a cavity. The resonator includes a MEMS device positioned in the cavity including a substrate, a movable plate and a thermal actuator. The thermal actuator is has a first end coupled to the substrate and a second end coupled to the plate. The actuator moves the plate between a first and a second position in relation to the substrate. The application is also directed to a method for operating the tunable filter.

19 Claims, 10 Drawing Sheets

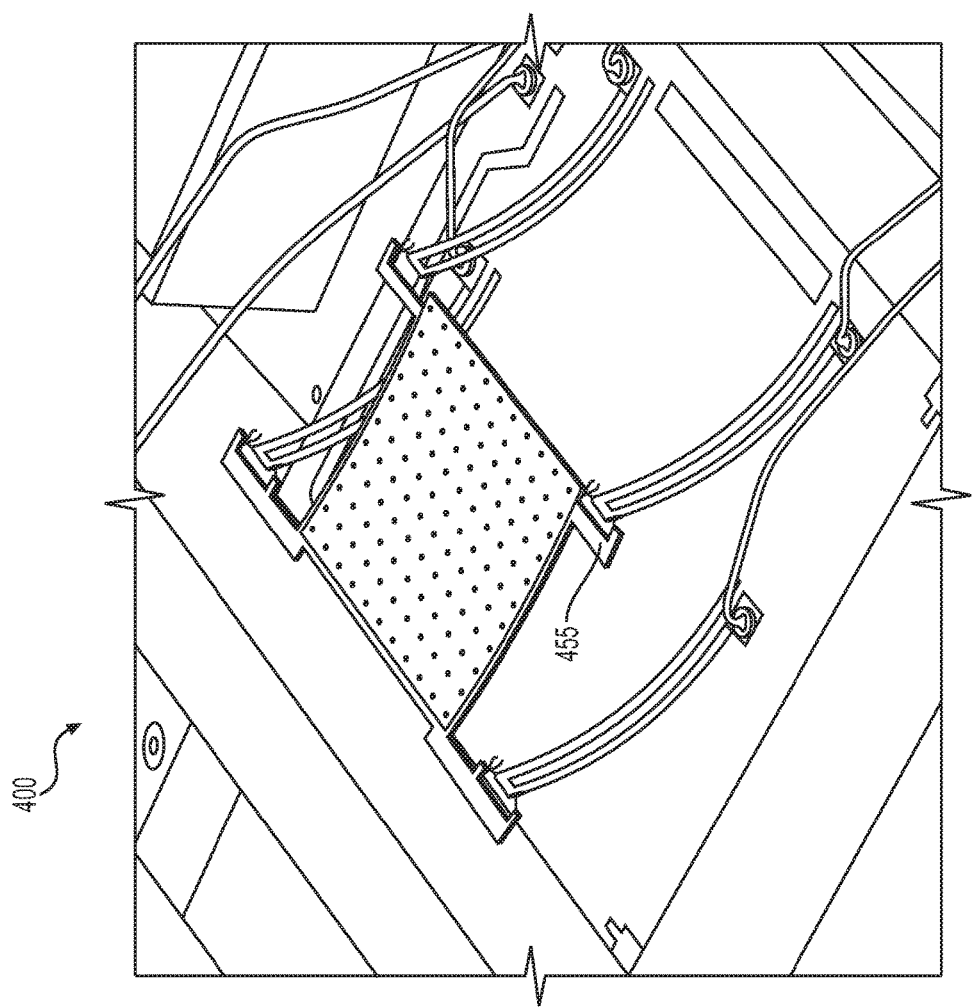

WIDELY TUNABLE CAVITY FILTER USING LOW VOLTAGE, LARGE OUT-OF-PLANE ACTUATION MEMS

CROSS-REFERENCE TO RELATED APPLICATIONS

This application claims priority to U.S. Provisional Application No. 62/254,387 filed Nov. 12, 2015, and is also related to a application titled, "MEMS DEVICE WITH LARGE OUT-OF-PLANE ACTUATION AND LOW-RESISTANCE INTERCONNECT AND METHODS OF USE" concurrently filed, which further claims priority to U.S. Provisional Application No. 62/254,380 filed on Nov. 12, 2015. The disclosures of which are incorporated herein by reference in their entirety.

BACKGROUND

1. Field

The application is directed to widely tunable cavity filters including large out-of-plane MEMS.

2. Related Art

MEMS devices have different names around the world. For example, MEMS is referred to as micromachines in Japan, or Micro Systems Technology (MST) in Europe. MEMS devices are generally less than 250 microns and involve mechanical motion. MEMS are typically fabricated employing techniques used in the microelectronic industry, such as thin film deposition, thin film patterning via photolithography and reactive ion etching. MEMS devices offer advantages including but not limited to size, weight, cost, and Quality factor (Q).

Over the last decade, there has been increased research in the field of MEMS devices. For instance, deployment of MEMS devices has been explored in fields including but not limited to broadband, wireless, intelligent communications and radar systems for commercial and military applications. In particular, MEMS devices can be employed in tunable resonators that filter, for example, wideband radio frequency (RF) electromagnetic signals. These resonators generally require agile front-end filtering. Conventional resonators, however, exhibit diminished electrical performance with respect to its size.

What is desired in the art is a MEMS device and resonator including a MEMS device that exhibits improved electrical performance.

What is also desired in the art is a MEMS device and resonator including a MEMS device that exhibits improved out-of-plane actuation.

What is also desired in the art is a MEMS device and resonator including a MEMS device including fewer components resulting in smaller size and overall reduced cost in manufacturing.

[What is further desired in the art is a MEMS device and resonator which promotes environmental stability.

SUMMARY

The foregoing needs are met, to a great extent, by the application describing MEMS devices, tunable resonator filters including MEMS devices, and methods of use. The application is not limited to the subject matter described in the Summary section and is useful for purposes of introducing concepts explained in detail in the Detailed Description section.

One aspect of the application is directed to a tunable filter system. The system includes a resonator having an inner wall surrounding a cavity. The system also includes a MEMS device positioned in the cavity. The MEMS device includes a substrate having a first end and a second end extending along a longitudinal axis. The MEMS device also includes a movable plate having a first end and a second end. The MEMS device further includes a thermal actuator having a first end coupled to the first end of the substrate and a second end coupled to the first end of the plate, the actuator moving the plate between a first and a second position in relation to the substrate.

In one embodiment, the resonator includes a recessed portion formed in the inner wall of the resonator with the substrate is positioned in the recessed portion. In another embodiment, the substrate is substantially encapsulated in the recessed portion such that an upper surface of the substrate is substantially aligned with non-recessed areas of the inner wall.

In another embodiment, the resonator includes a post extending from the inner wall toward the cavity. In yet another embodiment, the MEMS device also includes a strap having a first end and a second end. The second end of the strap may be coupled to the first end of the plate. In even another embodiment, the strap is separated from the thermal actuator by a predetermined distance that is perpendicular to the longitudinal axis. Even further, the thermal actuator extends substantially parallel to the strap in the longitudinal axis. Yet even further, the predetermined distance is substantially uniform between the first and second ends of the thermal actuator and the strap. In even another embodiment, the strap is positioned between two thermal actuators.

In another embodiment, the filter system includes a second MEMS device positioned in the cavity at a predetermined distance from the MEMS device. The second MEMS device includes a substrate having a first end and a second end extending along a longitudinal axis. The second MEMS device also includes a movable plate having a first end and a second end. The a thermal actuator having a first end coupled to the first end of the substrate and a second end coupled to the first end of the plate, the actuator moving the plate between a first position and a second position in relation to the substrate.

According to a second aspect of the application, a method for operating a tunable filter is described. The method includes a step of providing a resonator including a MEMS device located in a cavity of the resonator. The MEMS device includes a substrate, movable plate and thermal actuator. In another step, the plate is actuated between a first position and a second position by applying electrical current to the thermal actuator. In another step, the plate is actuated between the plating between the first position and the second position by applying electrical power to the substrate.

In one embodiment, the plate moves about 1 mm between the first position and the second position. In another embodiment, the step of actuating the plate via applying current to the thermal actuator occurs before the step of actuating the plate via applying power to the substrate. In another embodiment, the plate of the MEMS device is actuated towards a post of the resonator that extends from an inner wall toward a central area of the cavity. In yet even another embodiment, an upper surface of the plate and a major surface of the post are positioned substantially parallel to one another and separated by a predetermined distance in the second position. In a further embodiment, the plate of the MEMS device is actuated toward a plate of a second MEMS device positioned in the cavity. In even a further embodiment, the plates of the MEMS device and the second MEMS device are positioned substantially parallel to one another and separated by a predetermined distance in the second position.

There has thus been outlined, rather broadly, certain aspects of the application in order that the detailed description thereof may be better understood, and in order that the present contribution to the art may be better appreciated. There are, of course, additional aspects of the application that will be described below and which will form the subject matter of the claims appended hereto.

BRIEF DESCRIPTION OF THE DRAWINGS

In order to facilitate a fuller understanding of the invention, reference is now made to the accompanying drawings, in which like elements are referenced with like numerals. These drawings should not be construed as limiting the invention and intended only to be illustrative.

FIG. 4 illustrates a MEMS device coupled to a power source according to yet another embodiment of the application.

DETAILED DESCRIPTION

Figure 1:
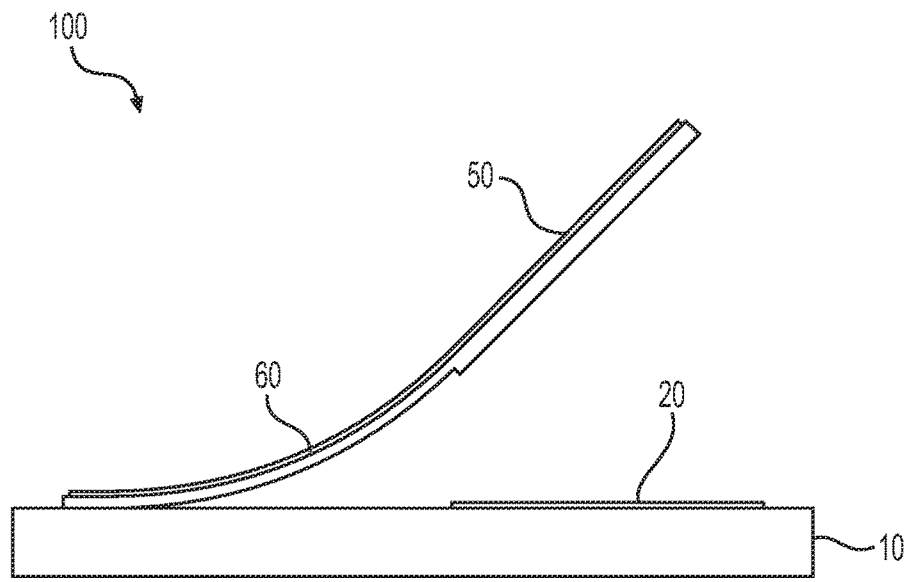
FIG. 1 illustrates a side view of a MEMS device according to an embodiment of the application.

Before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

Reference in this application to "one embodiment," "an embodiment," "one or more embodiments," or the like means that a particular feature, structure, or characteristic described in connection with the embodiment is included in at least one embodiment of the disclosure. The appearances of, for example, the phrases "an embodiment" in various places in the specification are not necessarily all referring to the same embodiment, nor are separate or alternative embodiments mutually exclusive of other embodiments. Moreover, various features are described which may be exhibited by some embodiments and not by the other.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

As used herein, "out-of-plane" deflection means the deformation is in a direction perpendicular to the largest linear dimensions of the resonator. For example, where the largest linear dimensions are in directions across a substrate surface, out-of-plane is in the vertical direction, away from the substrate. The out-of-plane deflection is referred to herein as "static" because it is a result of a residual stress gradient in the structural layer from which the resonator is formed. The residual film stress gradient in the structural layer induces a strain gradient, or deflection, along the length L when the resonator is at rest.

Many radio products feature wideband frequency performance. These wideband radios generally require frequency agile front-end filtering. The embodiments presented for the instant application exhibit improved electrical performance, compact size, reduced weight, and decreased power.

According to the present application, it has been determined that devices and systems may be employed via novel MEMS architectures. For example, the MEMS device is configured to be both thermally and electrostatically actuated. Electrostatic actuation can be employed to control the action of very small devices, such as a microshutter and comb-drive. The deflection of the moving electrode is controlled by thermal and/or electrostatic forces. Preferably deflection is controlled by both thermal and electrostatic forces. The moving electrode rotates about an axis and employs a torsional-cantilever action. In one embodiment, the MEMS device is pushed via thermal actuation. In another embodiment, the MEMS device is pulled via electrostatic actuation.

The degree of out-of-plane actuation is considered large, preferably measuring about 1 mm or more in movement. For example, Table 1 as provided below, describes an embodiment where applied voltage (V) affects the height (microns) of actuation of the MEMS device. For example, at an applied voltage of 0, the plate of the MEMS device is 1,702 microns from the substrate. As voltage increases, the distance between the plate of the MEMS device and the substrate decreases.

TABLE 1

| Voltage (V) | Current (mA) | Power (mW) | Resistance (Ω) | Height (μm) |
|---|---|---|---|---|
| 0 | 0 | 0 | 0 | 1702 |
| 0.1 | 28.2 | 2.82 | 3.55 | 1700 |
| 0.2 | 54.7 | 10.94 | 3.66 | 1649 |
| 0 | 78.3 | 23.49 | 3.83 | 1534 |
| 0.4 | 98.8 | 39.52 | 4.05 | 1305 |
| 0.5 | 118.2 | 59.1 | 4.23 | 882 |
| 0.6 | 134.7 | 80.82 | 4.45 | 506 |
| 0.7 | 150.2 | 105.14 | 4.66 | 332 |
| 0.8 | 161.3 | 129.04 | 4.96 | 211 |

According to the application, large capacitance changes in relation to changes in ambient temperature are envisaged. For example, a capacitor plate can be coupled to a bimorph which actuates in relation to another capacitor plate on a substrate. In one embodiment, the other capacitor plate may be embedded in the substrate. By so doing, large out-of-plane actuation with controlled capacitance is achieved.

According to one aspect of the application, a tunable filter is disclosed employing large out-of-plane actuation MEMS devices. The tunable filter is used for example, in telecommunications applications in view of its small weight and dimensions. In even another embodiment, the devices and systems may be employed in a wireless communication system including RF-MEMS to achieve wide-band, low-loss tuning. Moreover, the systems exhibit low power, high-Q (quality factor) tunable elements.

In an embodiment, the tunable cavities of the application exhibit good performance resulting in a Q better than about 200 and wide tuning ranges. The tunable cavity preferably is made of metal and includes a planar substrate positioned therein. A metallic post has been machined at the center of the cavity, which is positioned near to the tip of the MEMS cantilevers. This provides a high-Q variable capacitance. It also considerably reduces the resonator electric size.

According to an aspect of the application, as shown in FIG. 1, the MEMS device 100 includes a substrate 10. The substrate has a first end and a second end extending along a longitudinal axis of the MEMS device 100. The substrate 10 may be formed from materials known in the art. In an exemplary embodiment, the substrate is substantially made of silicon.

An electrostatic actuator/sensor 20 is located on a surface of the substrate 10. In one embodiment, the sensor 20 is located near a second end of the substrate 10. The electrostatic actuator/sensor 20 is comprised of two separated layers of polysilicon. A voltage potential difference between the separated polysilicon layers leads to an attractive electrostatic force, bringing the two layers together. A greater voltage potential difference generates a greater attractive electrostatic force and capacitance, resulting in a decrease in gap spacing between the two layers. Since the capacitance and gap spacing are highly proportional, the measured capacitance is also used to sense the spacing between the two layers. In one embodiment, the sensor 20 may be an electrostatic electrode.

The MEMS device 100 also includes a plate 50 having a first end and a second end as illustrated in FIG. 1. The first end of the plate 50 is fixed to the first end of the substrate 10 via a fixation means. The fixation means may include a clamp or a fixing plate. Meanwhile, the second end of the plate 50 may be substantially pulled toward the second end of the substrate 10 via electrostatic actuation.

The plate 50 may be substantially flat in relation to a surface of the substrate 10 when no thermal and/or electrostatic actuations are employed. The plate 50 can be made of materials including but not limited to polysilicon and metal. The metals may include, for example, chrome, nickel, aluminum, titanium gold, silver and combinations thereof. To decrease the curvature of the plate 50, the thickness is increased by using multiple layers. The thickness of the plate 50 may range from about 1 to 10 microns. The thickness may preferably ranges between 2 and 8 microns.

The plate 50 may be made by corrugation techniques. For instance, the plate 50 may be formed by depositing alternating layers of structural polysilicon and sacrificial silicon oxide onto a silicon substrate 10. A final layer of metal may then be deposited. Acid etching of the silicon oxide after the manufacturing process completely removes the silicon oxide thus freeing the polysilicon and metal layers of the substrate 10.

Figure 3A:
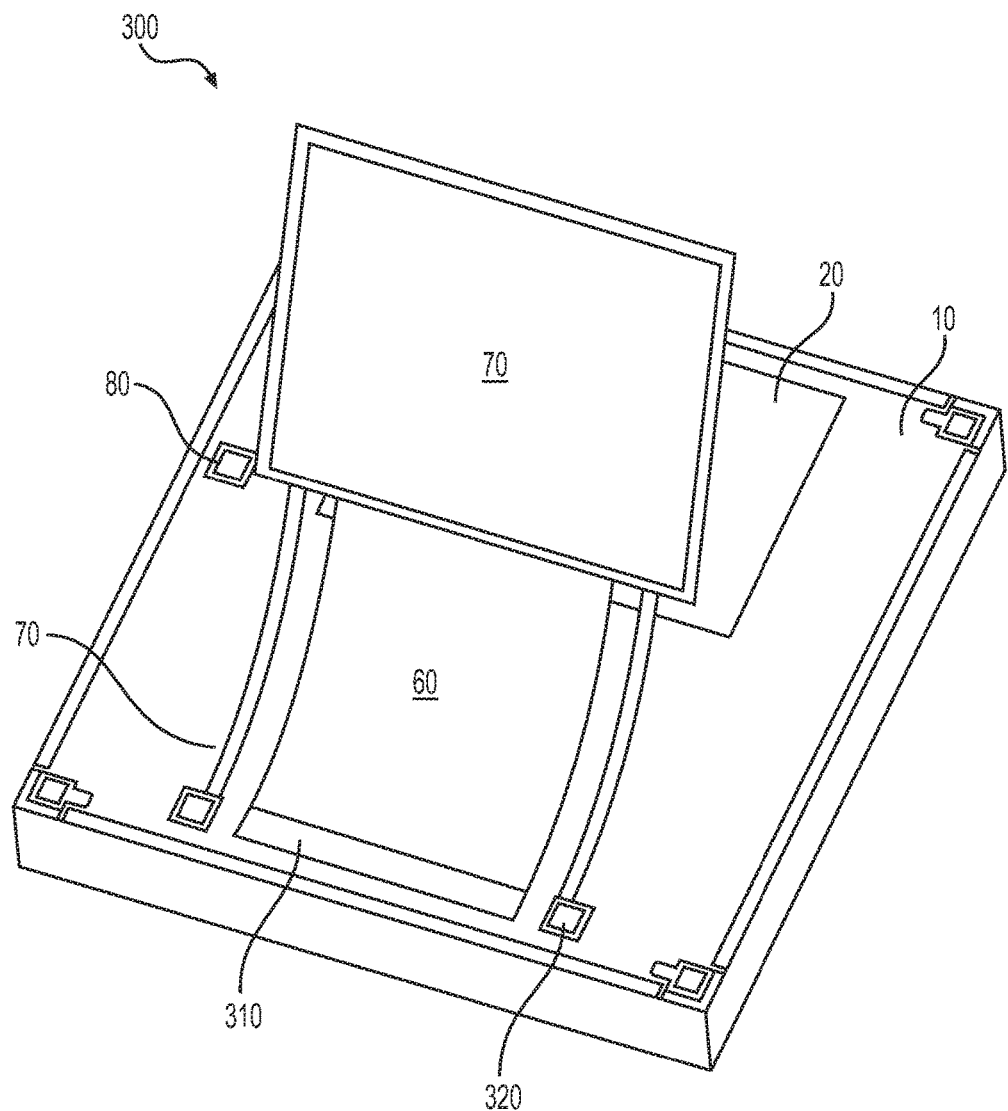
FIG. 3A illustrates an isometric view of a MEMS device according to an embodiment of the application.

The plate is electrically connected to a contact pad positioned at a first end of the substrate 10 via a strap 60. The strap 60 extends between a first end and a second end along a longitudinal axis of the MEMS device 100. The first end of the strap 60 is positioned at the first end of the substrate 10 and the second end of the strap 60 is positioned adjacent to a first end of the plate 50. As shown in FIG. 3A, the strap 60 is fixed to the substrate 10 via a coupling means 310. The coupling means 310 may be any fixing component, such as a clamp or fixing plate, which maintains the strap 60 in a fixed position with respect to the substrate 10.

As illustrated in FIG. 1, the thickness of the plate 50 is greater than the thickness of the strap 60. In another embodiment, the thickness of the plate 50 may be less than the thickness of the strap 60. In even another embodiment, the thickness of the plate 50 and strap 60 may substantially be the same.

In one embodiment, the second end of the strap 60 is connected to the first end of the plate 50. In one embodiment, the strap 60 is mechanically coupled to the plate 50. In another embodiment, the strap 60 and plate 50 may form a single, unitary structure via Focused Ion Beam (FIB), chemical etching, physical vapor deposition, photolithography and combinations thereof.

The strap 60 generally includes a transition metal. In one embodiment, the strap 60 may only include a single transition metal. In another embodiment, the transition metal may be selected from gold, chromium and combinations thereof.

Figure 2:
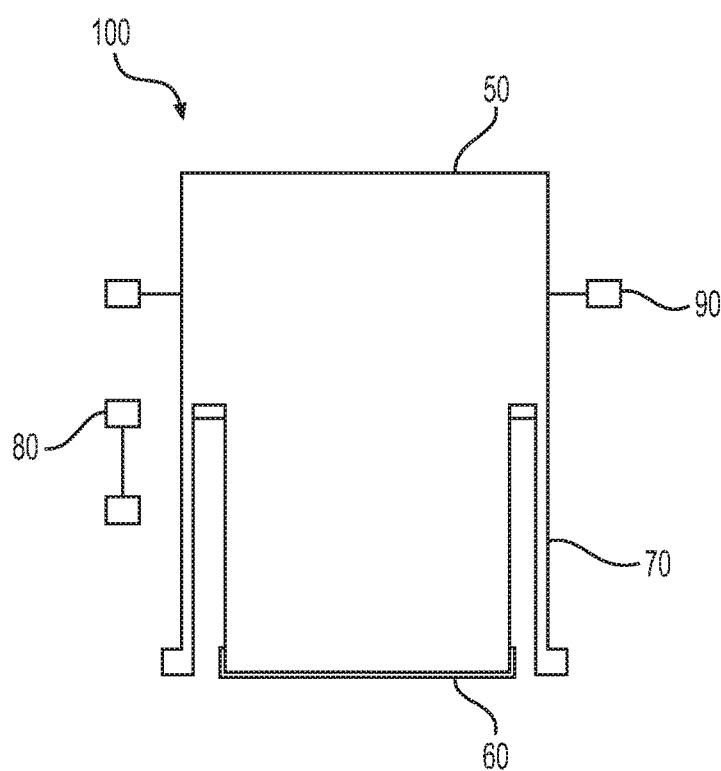
FIG. 2 illustrates a top view of a MEMS device according to an embodiment of the application.

The MEMS device 100 also includes one or more thermal actuators 70. The thermal actuators 70 as shown in FIGS. 2 and 3A are coupled to the plate 50. The thermal actuators 70 may form a single, unitary structure with the plate 50 by any known bonding technique, such as for example, via FIB, chemical etching or combinations thereof. Alternatively, the thermal actuators 70 may be mechanically coupled to the plate 50. For example, as shown in FIG. 4, the plate 50 employs connectors that permit multiple thermal actuators to be affixed thereto. As shown, the plate 50 includes four connectors 455 extending from a section of each corner of the plate 50. Here, there are four thermal actuators 70 respectively connected to the connectors 455.

The thermal actuators 70 include a first and a second end. The thermal actuators 70 generally extend between a first end of the substrate 10 and a first end of the plate 50. This is shown, for example, in FIG. 3A. The first end of the thermal actuators 70 are fixed to the substrate by a coupling means 320. Coupling means 320 may be a functional equivalent of coupling 310.

In an alternative embodiment, such as in FIG. 4, first ends of the thermal actuators 70 may be fixed at various locations on the substrate 10. As shown, first ends of two thermal actuators 70 are positioned at a first end of the substrate 10. Meanwhile, first ends of two additional thermal actuators 70 are positioned around a central portion of the substrate 10.

The thermal actuator 70 is comprised of polysilicon and metal, forming a bimorph. Tensile and compressive stress differences between the metal and polysilicon layers introduce a curvature within the bimorph. Namely, the thermal actuator comprising a bimorph responds to changes in ambient temperature, e.g., the thermal environment. In one embodiment, the bimorphs have two layers along with a single insulating layer. However, those skilled in the art will appreciate that the bimorph members of the present invention are not limited to this configuration. For example, the insulating layers may be omitted leaving only two layers if electrical isolation of the two layers is not desired.

According to another embodiment, the one or more thermal actuators as bimorphs have dissimilar thermal coefficients of expansion which respond differently to thermal actuation. For example, the first layer of the bimorph may comprise a material such as gold, nickel, or another metallic material having a higher coefficient of expansion relative to the material of a second layer. The second layer may comprise a material having a lower coefficient of expansion relative to the material of the first layer, such as silicon or another suitable semiconductor material. The second layer, or silicon layer, may be split so that a current may be passed through the silicon layer. Namely, the thermal actuators are connected to a power source to obtain the necessary current to promote actuation. Movement of the thermal actuators 70 causes the capacitor plates, such as the plate 50 and substrate 10, to move closer and farther from one another. This causes a variation in the capacitance. In an exemplary embodiment, electrostatic static actuation between an electrode 20 on the substrate and the plate 50 may be employed to change the spacing. This ultimately affects the capacitance.

In one embodiment, as shown in FIG. 3A, the thermal actuator 70 extends substantially parallel and adjacent to the strap 60. Namely, the thermal actuator 70 is spaced apart from the strap 60 by a predetermined distance along the longitudinal axis of the MEMS device 100. In an exemplary embodiment, the strap 60 is positioned between two thermal actuators 70. The two thermal actuators 70 are spaced apart from one another by a predetermined distance along the longitudinal axis of the MEMS device 100. The two thermal actuators 70 are also spaced apart from the strap 60 by a predetermined distance. In one embodiment, the distance between each thermal actuator 70 and the strap 60 is substantially equivalent.

The substrate 10 may include a temperature detector 80 as illustrated in FIG. 2. Since changes in temperature affect the curvature of the thermal actuators, the ambient temperature influences the position of the plate. In another embodiment, a temperature detector is positioned on the substrate. The linear relationship between the change in resistance of the polysilicon and change in temperature permits its use for temperature detection. The good thermal conductivity of the silicon substrate gives rise to near-isothermal conditions between the MEMS device and surrounding environment. Therefore, the calibrated resistance-to-temperature relationship in conjunction with the calibrated temperature-to-height relationship allows for high resolution plate position changes due to ambient temperature changes.

Figure 3B:
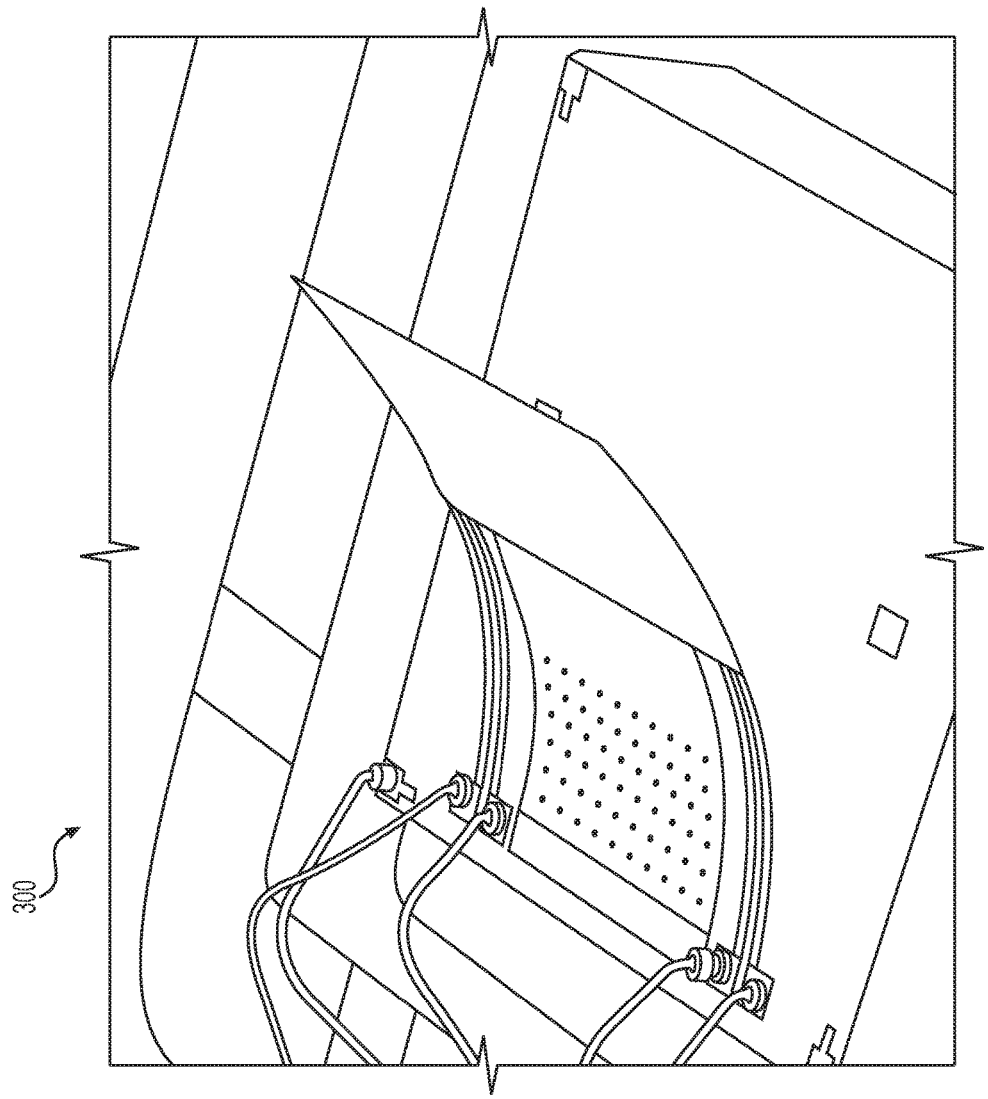
FIG. 3B illustrates a view of a MEMS device coupled to a power source according to an embodiment of the application.

FIGS. 3B and 4 illustrate thermal actuators 70 electrically coupled to a power source (not shown) via leads. An electrical current passed through the thermal actuators 70 heats the metal and polysilicon layers by virtue of resistive heating. The metal has a faster rate of thermal expansion, thereby causing a decrease in curvature of the bimorph. Higher current levels induce increased resistive heating and result in a greater reduction of curvature of the bimorph.

According to another embodiment, as shown for example in FIG. 2, the MEMS device 100 includes tethers 90 operably coupled to the plate 50. The tethers 90 are comprised of polysilicon. In an embodiment, the tethers 90 connect the plate to the wafer during prior employing power to the plate and/or substrate. An electrical current passed through the tethers 90 heats the polysilicon due to resistive heating and the temperature increases until the tethers 90 melt. FIG. 3B illustrates the tethers in a melted state where the plate 50 is displaced from the substrate 10.

Another aspect of the application is directed to a method of operating a MEMS device. The method includes the step of providing a MEMS device (step 1). The MEMS device may be based upon the above-mentioned embodiments.

There is also a step of actuating the plate by applying electrical current, heat or power to the thermal actuator (step 2).

Further, there is a step of actuating the plate by applying electrical current/power to the substrate causing electrostatic actuation of the plate (step 3). Electrostatic forces can be employed for providing both pull-down and attractive forces. A voltage is applied to the electrostatic actuator/sensor that provides a potential difference between its separated polysilicon layers. This leads to an attractive electrostatic force and capacitance resulting in a decrease in space between a lower face of the plate 50 and the upper face/surface of the substrate 10. Based upon the proportional relationship between the capacitance and gap/space between the substrate 10 and plate 50, the measured capacitance may also be employed to sense the spacing between the separated layers.

In one embodiment, the electrical current is applied to the thermal actuator before applying current to the substrate 10. In other words, actuation resulting from the thermal actuator occurs prior to actuation resulting from the electrostatic actuator. In another embodiment, the plate 50 moves toward the substrate when greater electrical current is provided to the thermal actuator or to the electrostatic actuator. Even further, the thermal actuator may include detectors to compensate for ambient temperature. Applying a current to the thermal actuator causes an increase to the spaced-apart relationship D between the sensor 20 and the plate 50 first resulting in a desired variation of capacitance between them.

According to even another embodiment, the plate moves in relation to the substrate between a first position 'x' and a second position 'x'+'y'. The actuation distance may be up to 2 mm. According to one embodiment, the results of a tunable filter's frequency/loss versus applied voltage are shown in Table 2 below. As shown, the insertion loss gradually increases from about −8.50 dB to −7.42 dB between an applied voltage of 0 and 0.22 volts. Moreover, the tuning frequency (GHz) increases between 4.73 and 7.4 GHz during an applied voltage ranging from 0 to 0.22 volts.

TABLE 2

| Voltage (V) | Tuning Frequency (GHz) | Insertion Loss (dB) |
| --- | --- | --- |
| 0 | 4.73 | −8.50 |
| 0.01 | 4.74 | −8.53 |
| 0.02 | 4.74 | −8.50 |
| 0.03 | 4.75 | −8.51 |
| 0.04 | 4.75 | −8.53 |
| 0.05 | 4.76 | −8.57 |
| 0.06 | 4.78 | −8.62 |
| 0.07 | 4.81 | −8.52 |
| 0.08 | 4.83 | −8.56 |
| 0.09 | 4.85 | −8.68 |
| 0.1 | 4.89 | −8.60 |
| 0.11 | 4.94 | −8.77 |
| 0.12 | 4.99 | −8.79 |
| 0.13 | 5.04 | −8.67 |
| 0.14 | 5.35 | −7.92 |
| 0.15 | 5.83 | −7.84 |
| 0.16 | 6.25 | −7.34 |
| 0.17 | 6.61 | −7.48 |
| 0.18 | 6.94 | −7.14 |
| 0.19 | 7.23 | −7.53 |
| 0.2 | 7.5 | −7.24 |
| 0.21 | 7.75 | −7.48 |
| 0.22 | 7.98 | −7.71 |
| 0.23 | 8.21 | −7.43 |

TABLE 2-continued

| Voltage (V) | Tuning Frequency (GHz) | Insertion Loss (dB) |
|---|---|---|
| 0.24 | 8.43 | −7.63 |
| 0.25 | 8.64 | −7.87 |
| 0.26 | 8.81 | −7.71 |
| 0.27 | 9 | −7.68 |
| 0.28 | 9.2 | −8.15 |
| 0.29 | 9.35 | −8.32 |
| 0.3 | 9.51 | −8.14 |
| 0.31 | 9.67 | −8.14 |
| 0.32 | 9.81 | −8.47 |
| 0.33 | 9.96 | −8.92 |
| 0.34 | 10.11 | −8.95 |
| 0.35 | 10.22 | −8.82 |
| 0.36 | 10.35 | −8.86 |
| 0.37 | 10.46 | −9.12 |
| 0.38 | 10.58 | −9.61 |
| 0.39 | 10.67 | −9.96 |
| 0.4 | 10.78 | −10.09 |
| 0.41 | 10.88 | −10.14 |
| 0.42 | 10.95 | −10.20 |
| 0.43 | 11.04 | −10.38 |
| 0.44 | 11.12 | −10.72 |
| 0.45 | 11.19 | −11.06 |
| 0.46 | 11.26 | −11.52 |
| 0.47 | 11.36 | −11.91 |
| 0.48 | 11.41 | −12.24 |
| 0.49 | 11.59 | −12.50 |
| 0.5 | 11.55 | −12.74 |

Tunable Cavity Filter

According to another aspect of the application, a widely tunable cavity filter is described that uses low voltage, large out-of-plane actuation MEMS. The filter exhibits a 3:1 tuning range and is scalable to different frequency bands. Moreover, the filter exhibits low loss and low power as described in Table 2 above.

Due to the cavity-based design, the filter maintains low-loss performance and a high-Q across the entire turning range. In one embodiment, the filter comprises at least one low voltage, large out-of-plane actuation MEMS. The architecture of the filter uses inductive coupling as a means to couple RF energy in and out of the cavity filter.

Figure 5A:
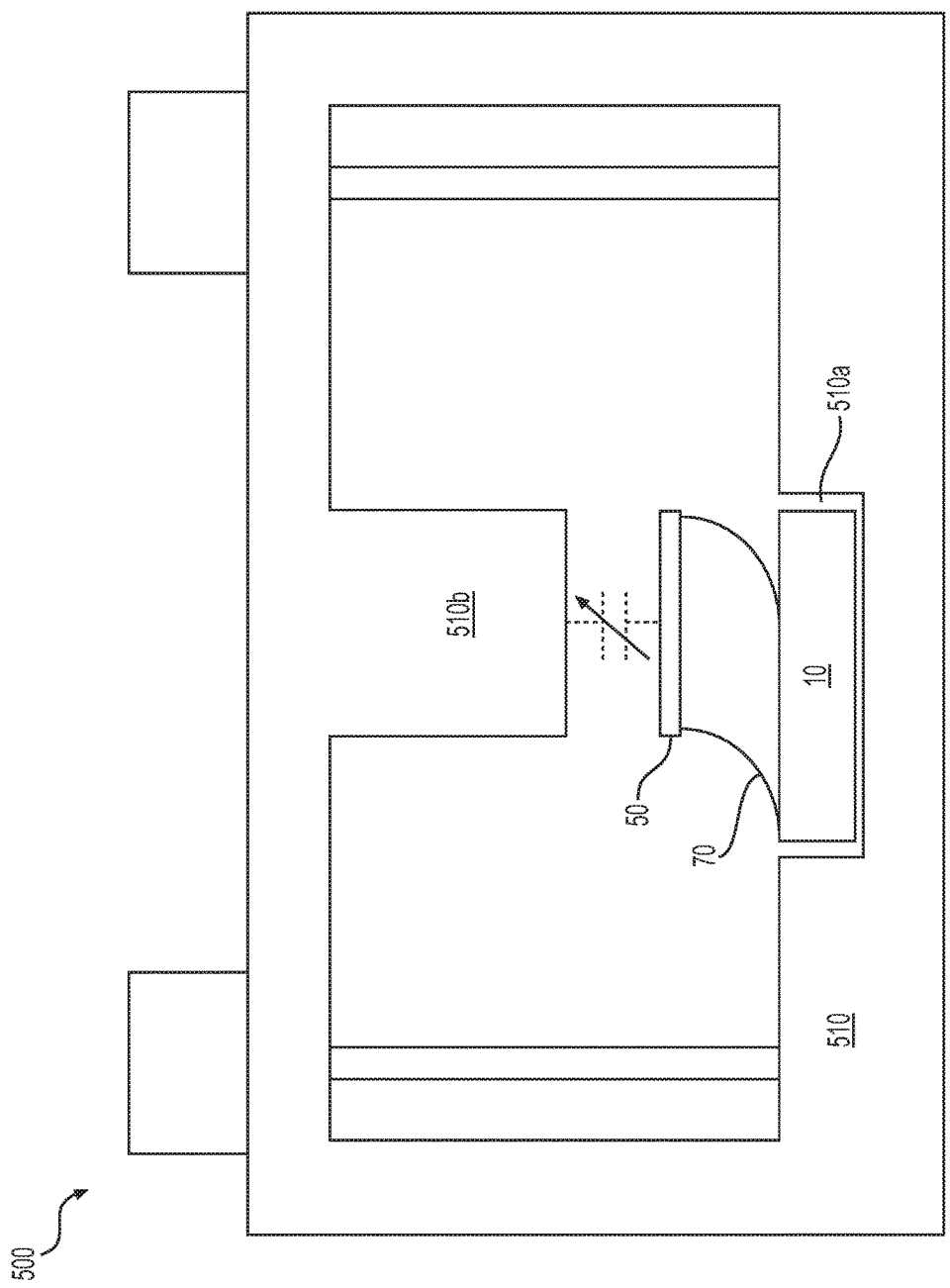
FIG. 5A illustrates a resonator cavity according to an embodiment of the application including a MEMS device.
Figure 5B:
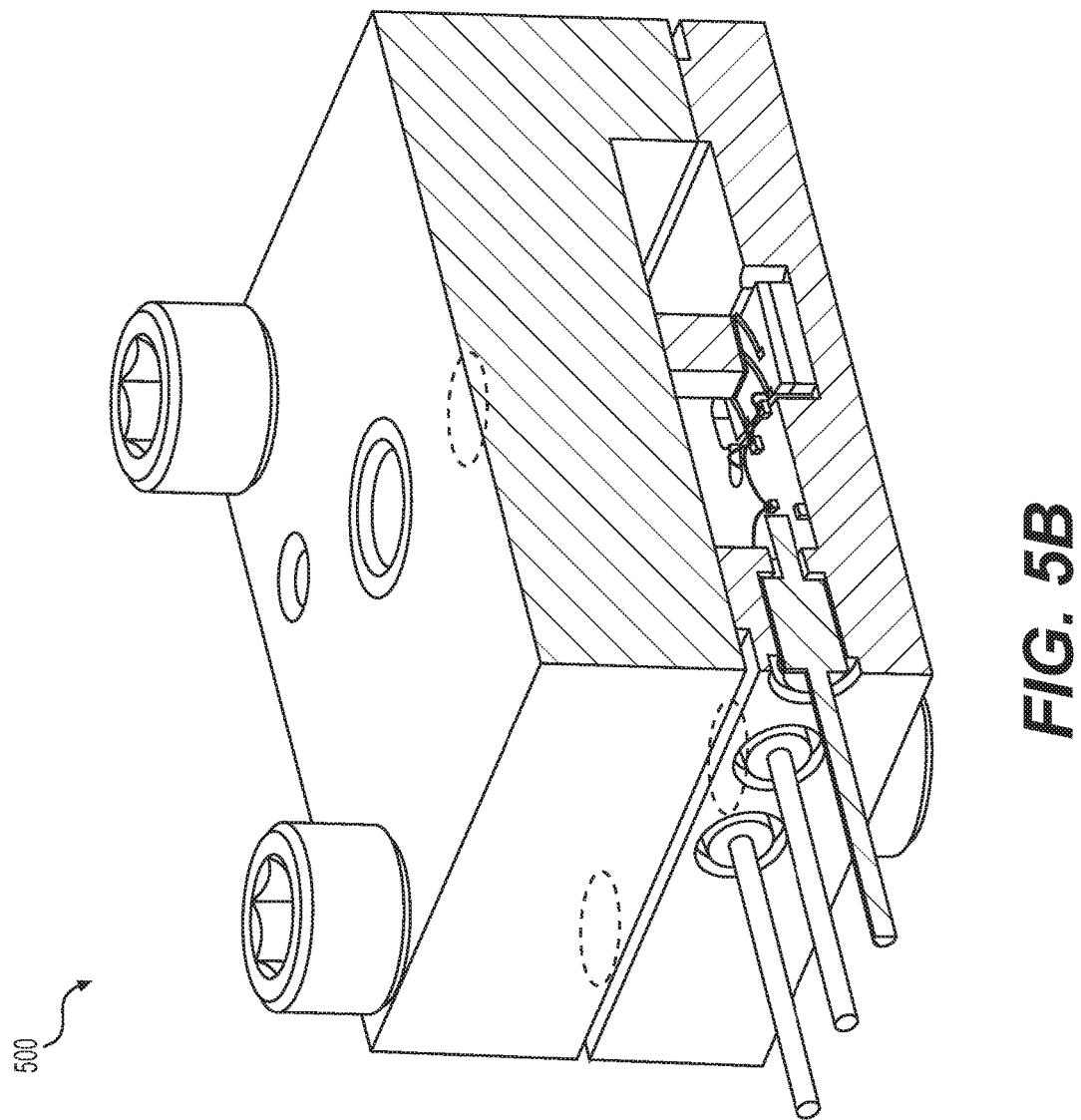
FIG. 5B illustrates an alternative view of the resonator cavity in FIG. 5A.

As shown in FIG. 5A, the apparatus 500 includes a rectangular evanescent-mode cavity resonator 510 at least one low voltage, out-of-plane actuation MEMS 100. The resonator 510 includes a recessed portion 510a formed on a first surface. The resonator 510 also includes a post 510b that extends from a second surface toward a center of the cavity resonator 510. Preferably the first surface is positioned opposite to the second surface. In an embodiment, the post is positioned substantially above the recessed portion spaced apart by a predetermined distance. Preferably, the post is substantially aligned with the recessed portion in the same plane.

The recessed portion preferably houses a substrate 10 of the MEMS 100. In one embodiment, substantially all of the substrate is positioned within the recessed portion 510a. As discussed above, the MEMS device 100 includes a plate 50 that is electrically coupled to a current source via a thermal actuator 70. In an embodiment, the plate 50 is attached to a strap 60. The strap 60 and plate 50 are actuated via the thermal actuator 70 from a first position to a second position. The first position may be located a distance 'x+y' from the substrate 10. The second position may be located a distance 'x' from the substrate. In one embodiment, the predetermined distance, such as for example, 'x+y' may be about 1 mm.

In one embodiment, the MEMS device 100 also includes an electrostatic actuator 30 positioned on or embedded within the substrate 20. The electrostatic actuator 30 is supplied with electrostatic energy via a power source to pull a plate 50 closer to the substrate 10 and electrostatic actuator 30. The electrostatic actuator 30 may be a conductor, such as gold, chromium, platinum, polysilicon or combinations thereof.

As depicted in FIGS. 5A-B and 6A-B, the MEMS plate 50 has a resting position tens of microns away from the fixed post 510b. The post 510b is oriented. In FIG. 5A, the plate is oriented substantially parallel to the substrate 10 that is positioned in the recessed portion 510a. The top surface of the substrate 10 is flush with internal, non-recessed surfaces of the cavity resonator 510. Tuning of the filter 500 is realized through varying the distance between the fixed post and the plate 50. A variable capacitance is created between the fixed post 510b and the moveable plate 50. Actuating the moving plate 50 farther from the fixed post 510 further tunes the filter.

Figure 6A:
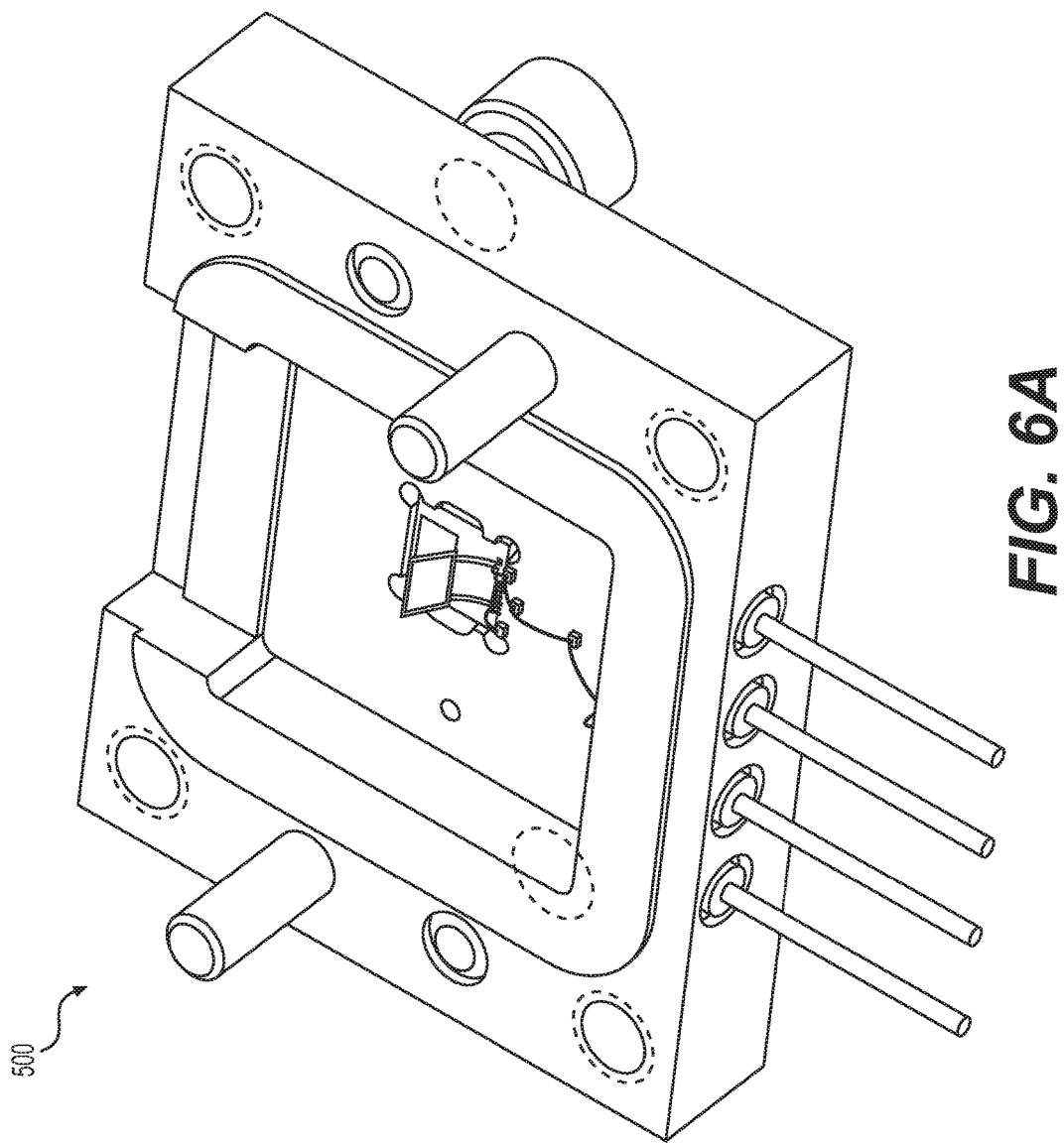
FIG. 6A illustrates a resonator cavity according to another embodiment of the application.
Figure 6B:
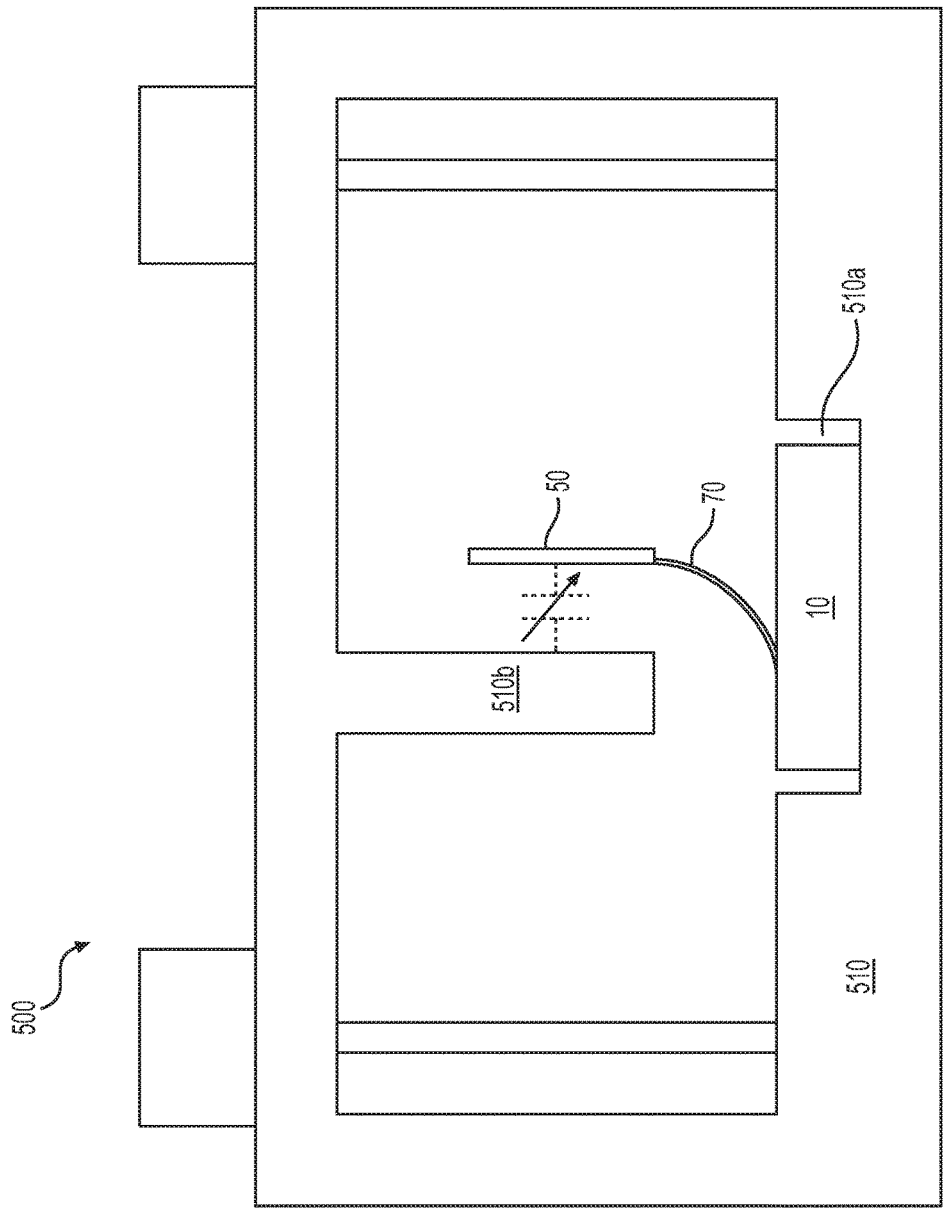
FIG. 6B illustrates an alternative view of the resonator cavity in FIG. 6A.

As shown in FIG. 6A, the post 510b is a different width from the post 510b depicted in FIG. 5A. Moreover, MEMS device 100 includes a thermal actuator 70 having a second end that is coupled to a first end of the plate 50. The plate is actuated from a position substantially parallel to the substrate 10 to a second position that is perpendicular to the substrate 10 yet substantially parallel to the post 510b. In one embodiment, the first position is considered the resting position when the plate 50 is parallel to an upper surface of the substrate 50 and a floor of the cavity resonator 500. Meanwhile, the second position is considered the tuning or active position when the plate 50 is parallel to a main surface of the fixed post 510b. Tuning of the filter is realized through varying the distance between the fixed post and the MEMS plate. A variable capacitance is created between the fixed post and moveable plate. Actuating the moveable plate farther from the fixed post further tunes the filter.

Figure 7A:
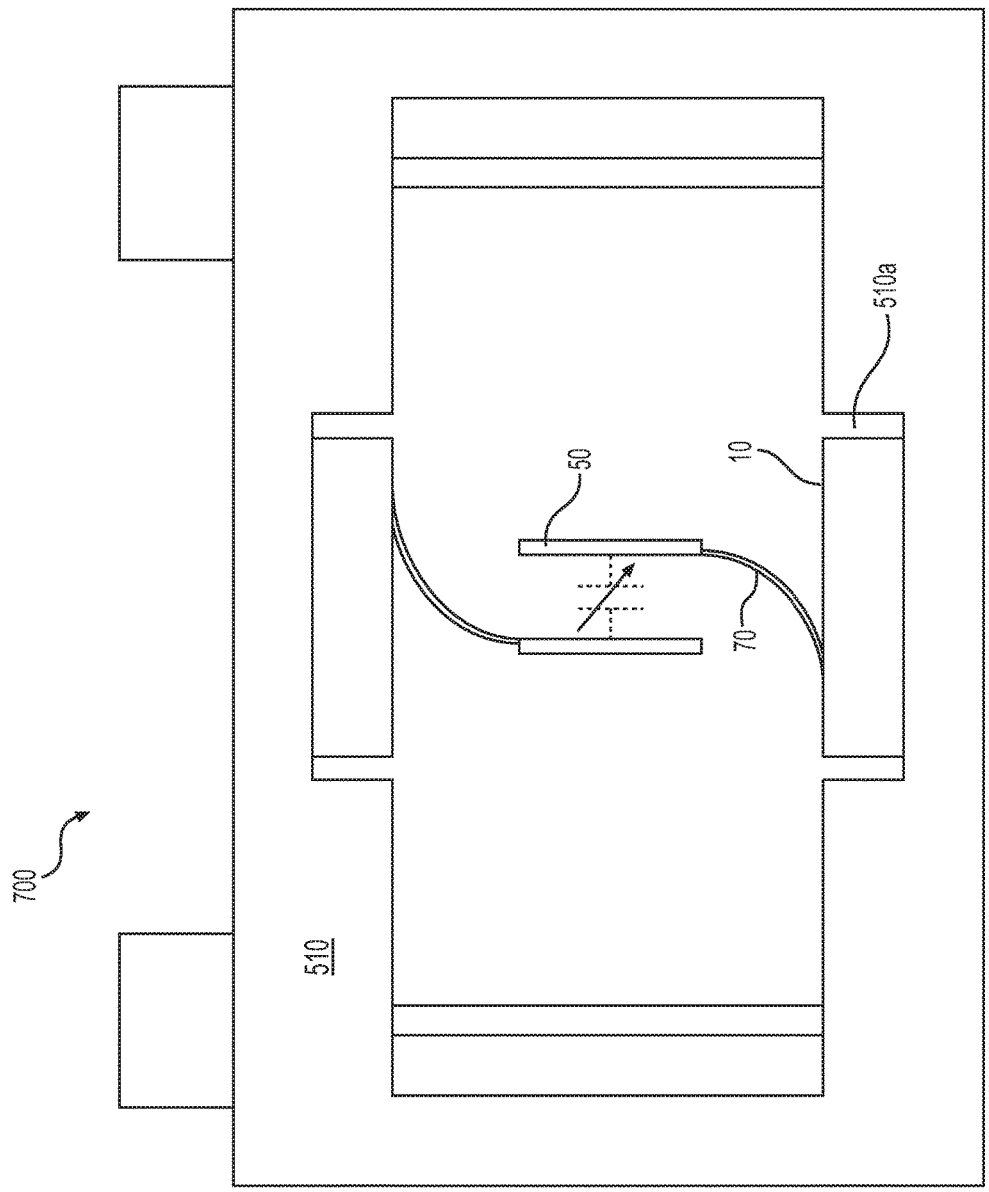
FIG. 7A illustrates a resonator cavity according to yet another embodiment of the application.
Figure 7B:
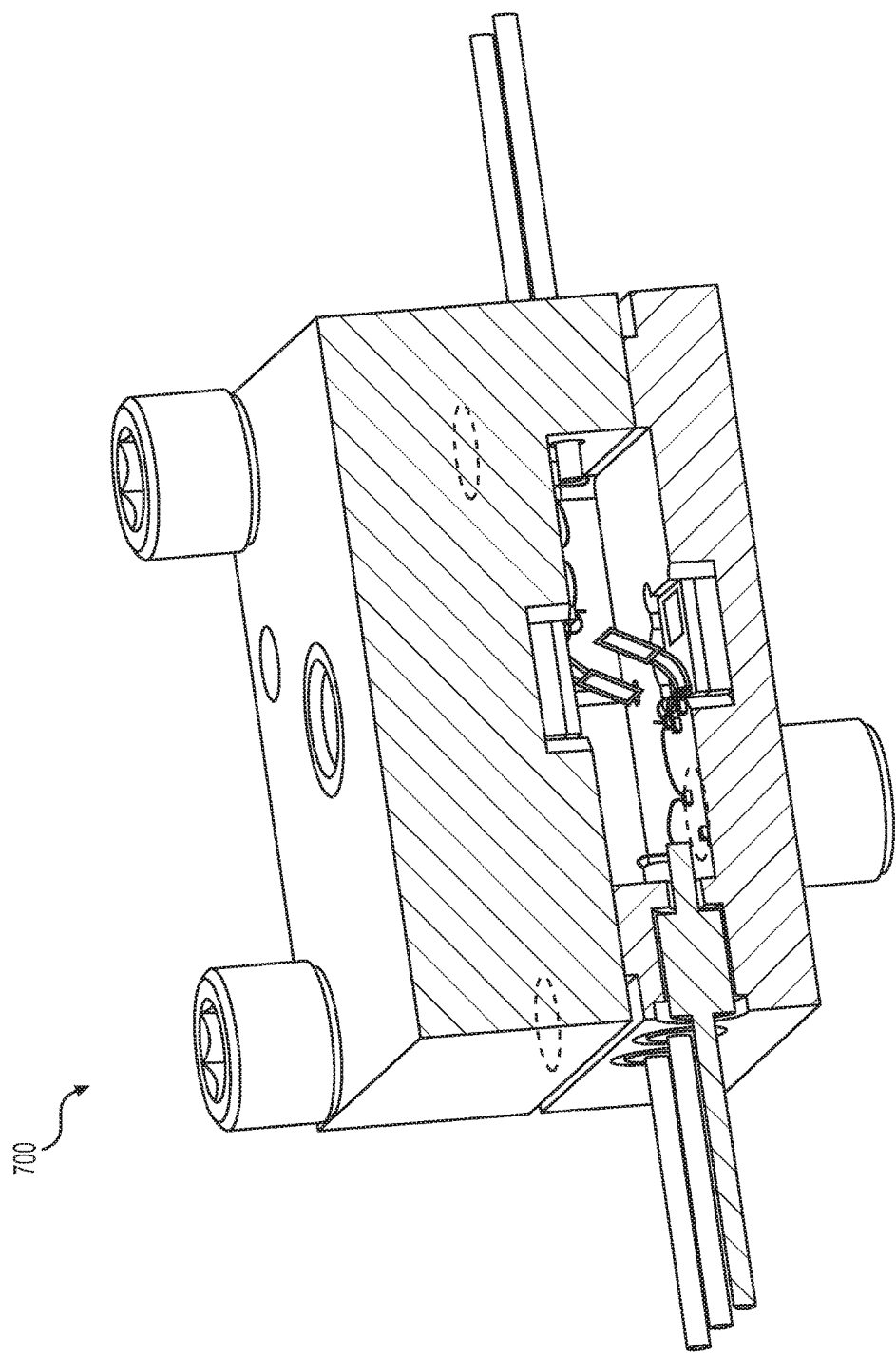
FIG. 7B illustrates another view of the resonator cavity in FIG. 7A.

According to another embodiment as depicted in FIG. 7A, the resonator cavity 510 includes two recessed portions 510a. The recessed portions 510a are located on opposing surfaces of the resonator 510. Namely, a floor and a ceiling, respectively. Apart from the embodiments depicted in FIGS. 5 and 6, the resonator cavity 700 in FIG. 7A includes two MEMS devices 100. The substrate 50 of each MEMS device 100 is located within the recessed portion 510a of the rectangular cavity resonator 510. Each of the MEMS devices is a low voltage, out-of-plane actuation MEMS device. Tuning of the filter is realized through varying the distance between the two moveable plates 50. A variable capacitance is created between the two moveable plates 50. Actuating the moveable plates 50 farther apart from one another further tunes the filter.

As depicted, one end of each plate 50 is coupled to respective thermal actuators 70. The plates 50 moves from a first position that is substantially parallel to the upper and lower surfaces of the resonator cavity 500. The plates 50 also move from a position that is substantially parallel to an upper surface of the substrate. In the second position, the plates 50 are positioned perpendicular to the upper and lower surfaces, as well as the upper surface of the substrate 10. In the second position, both plates 50 are oriented substantially parallel to each other.

According to yet another embodiment, a resonator cavity 510 including two MEMS devices 100 may move from a first position that is substantially parallel to the upper and lower surfaces of the cavity 510 and the upper surface of the substrate 10 to a second position that is also substantially parallel to the upper and lower surfaces of the cavity 510 and the upper surface of the substrate. In this embodiment, the thermal actuators 70 would be longer to ensure proper tuning between parallel capacitor plates 50. Alternatively in one embodiment, the height of the resonator cavity 510 may be modified to be commensurate with the length of the thermal actuators 70 in order to ensure optimal capacitance of the plates 50 during tuning between the first and second positions.

While the system and method have been described in terms of what are presently considered to be specific embodiments, the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

What is claimed is:

1. A tunable filter system comprising:
   a resonator having an inner wall surrounding a cavity; and
   a MEMS device positioned in the cavity including
      a substrate having a first end and a second end extending along a longitudinal axis,
      a movable plate having a first end and a second end, and
      a thermal actuator having one end coupled to the first end of the plate, the thermal actuator moving the plate between a first and a second position in relation to the substrate.

2. The system of claim 1, wherein
   the resonator includes a recessed portion formed in the inner wall of the resonator, and
   the substrate is positioned in the recessed portion.

3. The system of claim 2, wherein the substrate is substantially encapsulated in the recessed portion such that an upper surface of the substrate is substantially aligned with a non-recessed area of the inner wall.

4. The system of claim 1, wherein the resonator includes a post extending from the inner wall toward a center of the cavity.

5. The system of claim 1, wherein the MEMS device further comprises:
   a strap having a first end and a second end, the second end of the strap being coupled to the first end of the plate.

6. The system of claim 5, further comprising:
   a second MEMS device positioned in the cavity at a predetermined distance from the MEMS device, the second MEMS device including
      a substrate having a first end and a second end extending along a longitudinal axis,
      a movable plate having a first end and a second end, and
      a thermal actuator having a first end coupled to the first end of the substrate and a second end coupled to the first end of the plate, the actuator moving the plate between the first position and the second position in relation to the substrate.

7. The system of claim 6, wherein
   the plates of the MEMS device and the second MEMS device are configured to actuate between the first position and the second position,
   in the second position, the first and second ends of the plates of the MEMS device and the second MEMS device are substantially parallel to one another and separated by a predetermined distance.

8. The system of claim 5, wherein the plate of the MEMS device moves up to 2 mm between the first position and the second position.

9. The system of claim 5, wherein the strap is separated from the thermal actuator by a predetermined distance perpendicular to the longitudinal axis.

10. The system of claim 9, wherein the predetermined distance is substantia umiform between the first and second ends of the thermal actuator and the strap.

11. The system of claim 5, wherein
    the thermal actuator extends substantially parallel to the strap in the longitudinal axis.

12. The system of claim 5, wherein the strap is positioned between two thermal actuators.

13. A method for operating a tunable filter comprising:
    providing a resonator including a MEMS device located in a cavity of the resonator, the MEMS device including a substrate, movable plate and thermal actuator;
    actuating the plate between a first position and a second position by applying electrical current to the thermal actuator; and
    actuating the plating between the first position and the second position by applying electrical power to the substrate.

14. The method of claim 13, wherein
    the plate moves up to 2 mm between the first position and the second position.

15. The method of claim 13, wherein the step of actuating the plate via applying current to the thermal actuator occurs before the step of actuating the plate via applying power to the substrate.

16. The method of claim 13, wherein the plate of the MEMS device is actuated towards a post of the resonator extending from an inner wall of the resonator toward a center of the cavity.

17. The method of claim 13, wherein in the second position, an upper surface of the plate and a major surface of the post are positioned substantially parallel to one another and separated by a predetermined distance.

18. The method of claim 13, wherein the plate of the MEMS device is actuated toward a plate of a second MEMS device positioned in the cavity.

19. The method of claim 18, wherein the plates of the MEMS device and the second MEMS device are positioned substantially parallel to one another and separated by a predetermined distance in the second position.

* * * * *